(12) United States Patent
Semi

(10) Patent No.: US 6,847,124 B2
(45) Date of Patent: Jan. 25, 2005

(54) SEMICONDUCTOR DEVICE AND FABRICATION METHOD THEREOF

(75) Inventor: Atsushi Semi, Matsubara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/452,907

(22) Filed: Jun. 3, 2003

(65) Prior Publication Data

US 2004/0016949 A1 Jan. 29, 2004

(30) Foreign Application Priority Data

Jun. 4, 2002 (JP) ........................................ 2002-162800

(51) Int. Cl.$^7$ ............................................. H01L 29/40
(52) U.S. Cl. ...................................... 257/786; 257/773
(58) Field of Search ............................... 257/773, 786, 257/784, 781, 780

(56) References Cited

U.S. PATENT DOCUMENTS

| | | | |
|---|---|---|---|
| 5,036,383 A | * | 7/1991 | Mori ........................... 257/751 |
| 5,288,661 A | * | 2/1994 | Satoh et al. ................. 438/449 |
| 5,288,662 A | * | 2/1994 | Lagendijk et al. .......... 438/774 |
| 5,736,791 A | * | 4/1998 | Fujiki et al. ................. 257/781 |
| 6,313,540 B1 | * | 11/2001 | Kida et al. ................... 257/784 |
| 6,586,839 B2 | * | 7/2003 | Chisholm et al. ........... 257/773 |

FOREIGN PATENT DOCUMENTS

| | | |
|---|---|---|
| JP | 3-1538 A | 1/1991 |
| JP | 10-64945 A | 3/1998 |

* cited by examiner

Primary Examiner—Roy Potter
(74) Attorney, Agent, or Firm—Nixon & Vanderhye, P.C.

(57) ABSTRACT

A semiconductor device includes: a semiconductor substrate; a bonding pad having an interconnection region that provides for an external electrical contact; a first interlayer insulating layer interposed between the semiconductor substrate and the bonding pad; and a metal wiring layer that is embedded in the first interlayer insulating layer. The metal wiring layer is made of a softer material than that of the first interlayer insulating layer. The metal wiring layer at least partially overlaps with the interconnection region in the stacked direction of the layers, and the area of metal wiring layer overlapping with the interconnection region includes notches that extend through the metal wiring layer in the stacked direction and separate the metal wiring layer in the layer direction. Portions of the first interlayer insulating layer are embedded in the notches. This enables the size of the semiconductor device to be reduced by efficiently utilizing the underlying layers of the bonding pad while preventing cracking in these layers.

17 Claims, 8 Drawing Sheets

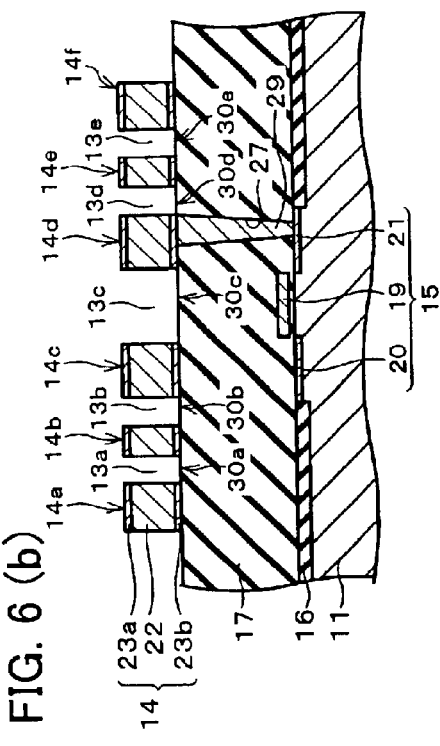
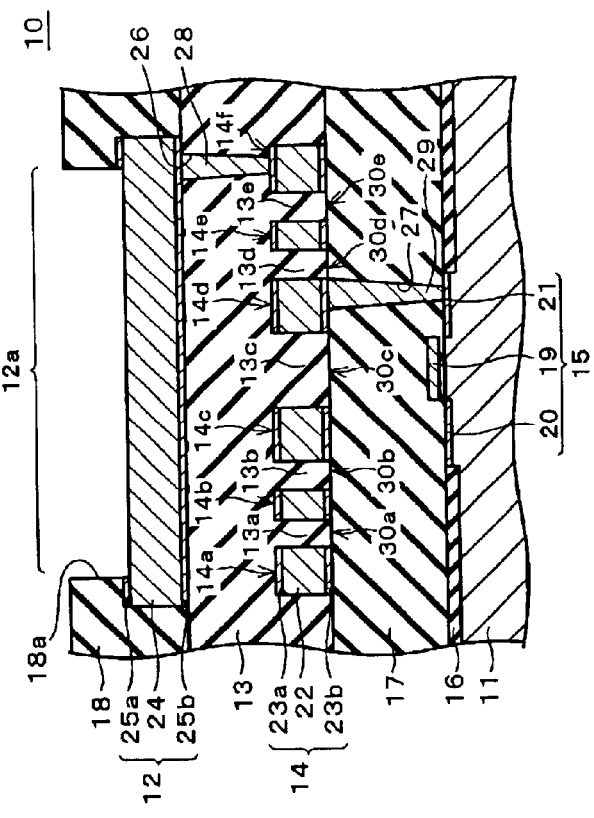
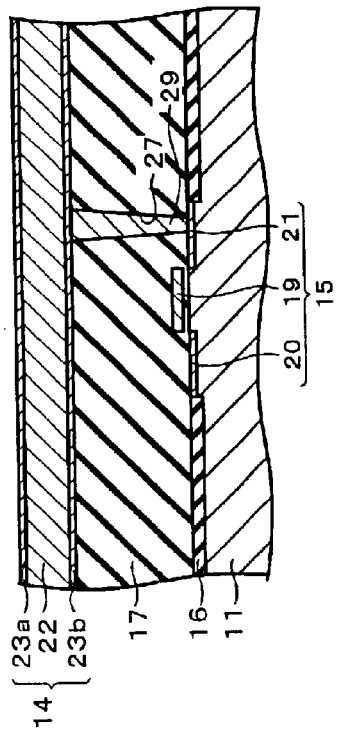
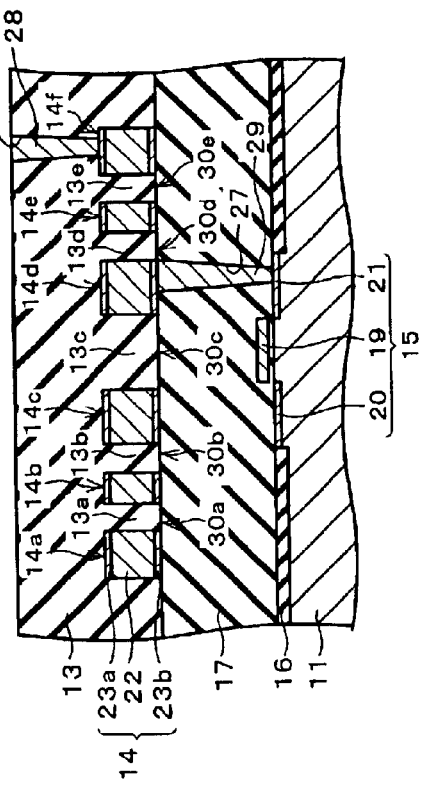
FIG. 6 (a)
FIG. 6 (b)
FIG. 6 (c)
FIG. 6 (d)

SEMICONDUCTOR DEVICE AND FABRICATION METHOD THEREOF

FIELD OF THE INVENTION

The present invention relates to a semiconductor device that includes an upper conducting layer, such as a bonding pad, having a region that provides for an external electrical contact, and a lower conducting layer, provided beneath the upper conducting layer, that is embedded in an insulating layer. The invention also relates to a fabrication method of such a semiconductor device.

BACKGROUND OF THE INVENTION

For the improvement of functionality and performance, semiconductor devices such as semiconductor integrated circuits are now equipped with a plurality of metal wiring layers for their internal wiring (multilayered wiring). In addition, semiconductor devices employ increasing numbers of bonding pads for the input and output of signals in and out of the semiconductor device.

In conventional multilayered wiring techniques, the bonding pad is often formed using the uppermost metal wiring layer, together with all the underlying metal wiring layers. Specifically, the shape of the bonding pad is substantially the same for that defined by the uppermost metal wiring layer as for those defined by the underlying metal wiring layers. These bonding pads of the respective metal wiring layers are then connected to one another through via holes or the like, so as to attain the same potential.

Such a configuration has been conventionally adopted for the reasons described below. In an alternative configuration where the bonding pad is formed only in the uppermost layer, an attempt to make a contact between the bonding pad and the underlying metal wiring layers or semiconductor element using only the via holes causes the following problems. First, position registration of the via holes becomes difficult in the respective layers. Another problem is the poor reliability of the connection between the respective layers through the via holes.

These drawbacks are solved by the foregoing configuration in which the bonding pads of the respective metal wiring layers are connected to one another through via holes or the like, so as to attain the same potential across these layers. By thus connecting the via holes through the metal wiring layers, contacts between these layers can be made more easily and more reliably.

A drawback of this configuration, however, is the problem it causes when the semiconductor element is disposed below the bonding pad. Namely, the bonding pad or an interlayer insulating layer between the bonding pads may crack by the impact caused by a tester prober in wafer testing, or a bonding head of a wire bonder in a bonding process in assembling the chip into a package in a later process. The crack may cause shorting of, for example, the bonding pad and the metal wire for the semiconductor element below the bonding pad, in which case the intended functions of the semiconductor element may be lost.

In recent years, integration of semiconductor devices has been advancing for higher functionality, larger capacity and system integration of the device. This has resulted in a proportional increase in chip size. Meanwhile, it is of a primary concern to reduce a chip size to lower chip cost. Various methods are available for the reduction of a chip size. For example, the reduction may be achieved by way of reducing the processing scale or simplifying the circuit. One method changes the layout of the device so that the area of the bonding pad can be used efficiently.

One example of such a technique for efficiently utilizing the area of the bonding pad is a technique known as an area pad technique, in which the active area of the semiconductor element is positioned below the bonding pad. However, it has been difficult to apply this technique to conventional structures as exemplified above, due to the susceptibility of the conventional structure to shorting caused by cracking in the bonding pad or the interlayer insulating layer between the bonding pads.

In applying the area pad technique, one way to overcome this drawback is to provide a thin film of organic material, such as a polyimide film, below the bonding pad, so as to absorb the force of impact. However, this causes another drawback in that it additionally requires a material, a processing device, or a processing step for providing such an organic thin film, which is disadvantageous in terms of cost of the semiconductor device.

Accordingly, in order to use the area pad technique, there is a need for a method that prevents cracking in the bonding pad or the interlayer insulating layer between the bonding pads, without greatly increasing the cost of the device.

In this connection, Japanese Publication for Unexamined Patent Application No. 1538/1991 (Tokukaihei 3-1538; published Jan. 8, 1991) discloses a technique for preventing cracking in the multilayered wiring technique. FIG. 8(a) is a plan view of a bonding pad 120 in a semiconductor device 100 disclosed in this publication, and FIG. 8(b) is a cross sectional view of the semiconductor device 100.

In the semiconductor device 100, a polycide wire 103a and a polycide wiring layer 103b are formed, via an insulating layer 102, on a surface of a semiconductor substrate 101 that is realized, for example, by a P-type silicon substrate 101a and an N-type silicon substrate 101b. On the stack of these layers are formed Al wiring layers 104, 105, and 106 with intervening interlayer insulating layers 107, 108, and 109. Finally, a surface protective coating 110 is formed to coat these layers.

The Al wiring layers 104, 105, and 106 constitute a bonding pad 120. The surface protective coating 110 on the Al wiring layer 106 is partially removed to create an opening 110a. The surface of the Al wiring layer 106 exposed in the opening 110a makes up an interconnection face 120a of the bonding pad 120.

In the interlayer insulating layers 108 and 109 are embedded a plurality of conducting members 111 and 112, respectively. In the interlayer insulating layer 107 is embedded a conducting member 113. The conducting members 111 through 113 are provided to connect the Al wiring layer 106 and the wire 103a to each other. The Al wiring layer 105 is provided to connect the conducting members 112 and 111 to each other, and the Al wiring layer 104 is provided to connect the conducting members 111 and 113 to each other.

The conducting members 111 and 112 are disposed in a staggered fashion so that they do not overlap with each other in a stacked direction of the layers. With this construction, the underlying Al wiring layers 104 and 105 can serve as a stress buffering layer when stress is exerted in a bonding process or other processes on the conducting members 111 and 112, for which a hard material is generally used. In this way, damage to the insulating layer 102 or the interlayer insulating layer 107 can be prevented.

Another technique for preventing cracking in the multilayered wiring technique is disclosed, for example, in Japanese Publication for Unexamined Patent Application No. 64945/1998 (Tokukaihei 10-64945; published Mar. 6, 1998). FIG. 9 is a perspective view of a bonding pad 200 in a semiconductor device disclosed in this publication.

The bonding pad 200 is structured such that electrodes 201 and 203 are connected to each other via conducting members 206 and 207 that are embedded in interlayer insulating layers 204 and 205. The conducting members 206 and 207 are connected to each other via an electrode 202. The electrode 202 has an openings 202a through which the interlayer insulating layers 204 and 205 are connected. With this construction, the interlayer insulating layers between the electrodes 201 and 203 make up a pillar 208, by which the interlayer insulating layers 204 and 205 are prevented from being cracked by a force of impact in a bonding process.

Despite the foregoing construction, the technique disclosed in Tokukaihei 3-1538 still has a high probability of developing cracks. The following describes a mechanism by which a crack is generated in the bonding pad or interlayer insulating layer in the construction of this publication.

Generally, wiring layers such as the Al wiring layers 104, 105, and 106 are made of a relatively softer material than that of the interlayer insulating layers 107, 108, and 109. In this case, when the bonding pad 120 is realized by multilayered metal of a relatively large area as in FIG. 8(a) and FIG. 8(b), the force exerted on the Al wiring layer 106 by a tester prober in wafer testing or by a bonding head of a wire bonder in a bonding process compresses and deforms the Al wiring layers 105 and 104, owning to the fact that the Al wiring layers 105 and 104 below the Al wiring layer 106 is materially softer. The force that compresses and deforms the Al wiring layers 104 and 105 generates stress that concentrates on deformed portions of the Al wiring layers 104 and 105 and the corresponding portions of the interlayer insulating layers 108 and 109. Thus, the area around the portions of concentrated stress has a high probability of developing cracking.

In should be note that, in order to prevent reflection of light during the exposure in a photolithography process, the upper and lower surfaces of the wiring layer are sometimes coated with barrier metal coatings, which are made of a relatively hard material such as TiN. These barrier metal coatings are also susceptible to cracking when the stress concentrates in the described manner.

Further, in the techniques disclosed in the foregoing publications, the area of the bonding pad is occupied by a plurality of layers defining the bonding pad. Consequently, the area of bonding pad cannot be used efficiently.

Taking the construction of Tokukaihei 10-64945 shown in FIG. 9 for example, the electrode 202 is integral with the electrodes 201 and 203 and connects the conducting members 206 and 207 to each other. In this respect, the electrode 202 can be regarded as a member that makes electrical connections in the stacked direction of the layers.

Meanwhile, a multiplicity of elements is two-dimensionally disposed on a plane of the substrate 209. In order to connect these elements, the wires formed on the plane of the electrode 202 may be used. In this case, the construction of FIG. 9 requires that the wires be formed by bypassing the area of the electrode 202. This is disadvantageous, in terms of wire layout, in efficiently utilizing the area of the bonding pad.

The same problem arises in the construction of Tokukaihei 3-1538 shown in FIG. 8(a) and FIG. 8(b).

SUMMARY OF THE INVENTION

An object of the present invention is to provide a semiconductor device that can be provided in a small size by efficiently utilizing the area of bonding pad while preventing cracking, and to provide a fabrication method of such a semiconductor device.

A semiconductor device of the present invention includes: a substrate; a first conducting layer having an interconnection region that provides for an external electrical contact; an insulating layer interposed between the substrate and the first conducting layer; and a second conducting layer embedded in the insulating layer and made of a softer material than that of the insulating layer. In the semiconductor device, the first conducting layer, the insulating layer, and the second conducting layer are stacked on the, substrate, and the second conducting layer has an area that at least partially overlaps with the interconnection region in a stacked direction of the first conducting layer, the insulating layer, and the second conducting layer, and the area of the second conducting layer overlapping with the interconnection region has at least one notch that extends through the second conducting layer in the stacked direction and separates the second conducting layer in a layer direction of the second conducting layer, and a portion of the insulating layer is embedded in the notch.

In this configuration, the second conducting layer that is made of a softer material than that of the insulating layer and is embedded in the insulating layer is interposed between the substrate and the first conducting layer having an interconnection region that provides for an external electrical contact, wherein the area of the second conducting layer overlapping with the interconnection region includes at least one notch that extends through the second conducting layer, and a portion of the insulating layer is embedded in the notch.

In this way, the portion of the insulating layer embedded in the notch serves as a pillar (wall) through the materially softer second conducting layer, and this pillar portion of the insulating layer supports the upper layer (the portion of the insulating layer embedded in the notch will be referred to as "supporting section").

With this construction, the force of impact on the interconnection region of the first conducting layer (for example, the force exerted by a bonding head in a bonding process) can be absorbed by the supporting section, which prevents the second conducting layer from being deformed. This suppresses cracking that may occur in the underlying layers of the interconnection region, including the first conducting layer, second conducting layer, insulating layer, and other intervening layers.

Further, the notch separates the second conducting layer in the layer direction of the second conducting layer. This enables the portions of the second conducting layer separated by the notch to be used for different purposes. For example, one of these portions may be used to connect the first conducting layer with the underlying layer, while another may be used as a wire that is insulated from the first conducting layer.

This is advantageous because the area of the second conducting layer overlapping with the interconnection region in the stacked direction of the layers can provide a wire that can be used independently by being insulated from the interconnection region of the overlying first conducting layer. Such an independent wire may be used to connect other electrical circuit elements of the semiconductor device to one another. For example, discrete electrical circuit elements on the plane of the substrate can be connected to one another. It is therefore possible to efficiently utilize the underlying layer of the interconnection region of the first conducting layer, which enables a size of the semiconductor device to be reduced (semiconductor device can be more highly integrated).

A fabrication method of the semiconductor device includes the steps of: forming the second conducting layer; forming at least one notch in the second conducting layer such that the notch extends through a stacked direction of the first conducting layer, the insulating layer, and the second conducting layer, and separates the second conducting layer in a layer direction of the second conducting layer; forming an insulating layer that is made of a harder material than that of the second conducting layer, such that the insulating layer covers the second conducing layer and fills the notch of the second conducting layer; and forming the first conducting layer such that the interconnection region of the first conducting layer overlaps in the stacked direction with an area of the second conducting layer where the notch is formed.

The semiconductor device with the foregoing effects can be fabricated using this method. The fabrication method can be implemented using materials and manufacturing conditions that are commonly used in conventional semiconductor device fabrication processes and the method does not specifically require any additional steps except for changing the patterning of the second conducting layer. Further, unlike conventional area pad techniques, the foregoing fabrication method does not require placing a thin film of organic material such as a polyimide film beneath the bonding pad. Accordingly, it is not required to additionally provide a material, a processing device, or a processing step for such an organic thin film, which makes it possible to suppress cost of the semiconductor device.

For a fuller understanding of the nature and advantages of the invention, reference should be made to the ensuing detailed description taken in conjunction with the accompanying drawings.

BRIEF DESCRIPTION OF THE DRAWINGS

FIG. 1(a) and FIG. 1(b) are drawings showing a semiconductor device according to one embodiment of the present invention, in which FIG. 1(a) is a plan view of the semiconductor device as viewed from the opposite side of a semiconductor substrate, and FIG. 1(b) is a cross sectional view of the semiconductor device of FIG. 1(a) taken along line A—A.

FIG. 6(a) through FIG. 6(d) are explanatory drawings illustrating a fabrication method of the semiconductor device of FIG. 1, in which FIG. 6(a) depicts the step of forming a second conducting layer, FIG. 6(b) depicts the step of forming a notch, FIG. 6(c) depicts the step of forming an insulating layer, and FIG. 6(e) depicts the step of forming a first conducting layer.

FIG. 8(a) and FIG. 8(b) are drawings showing a conventional semiconductor device, in which FIG. 8(a) is a plan view of the semiconductor device as viewed from the opposite side of a semiconductor substrate, and FIG. 8(b) is a cross sectional view of the semiconductor device.

DESCRIPTION OF THE EMBODIMENTS

Figure 1:
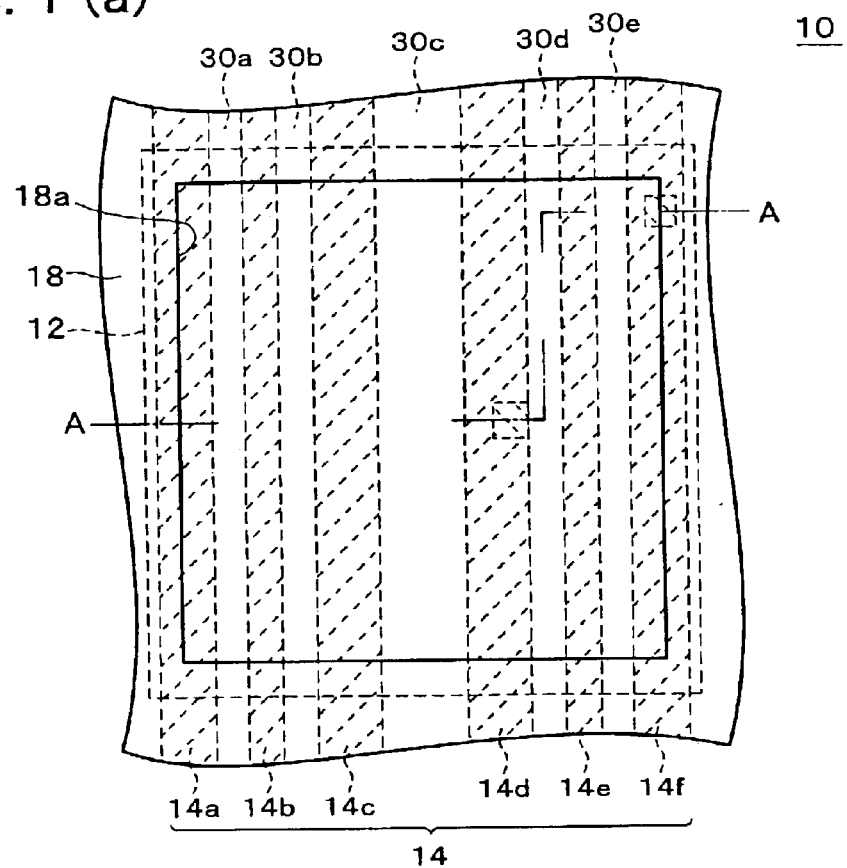
Figure 1:
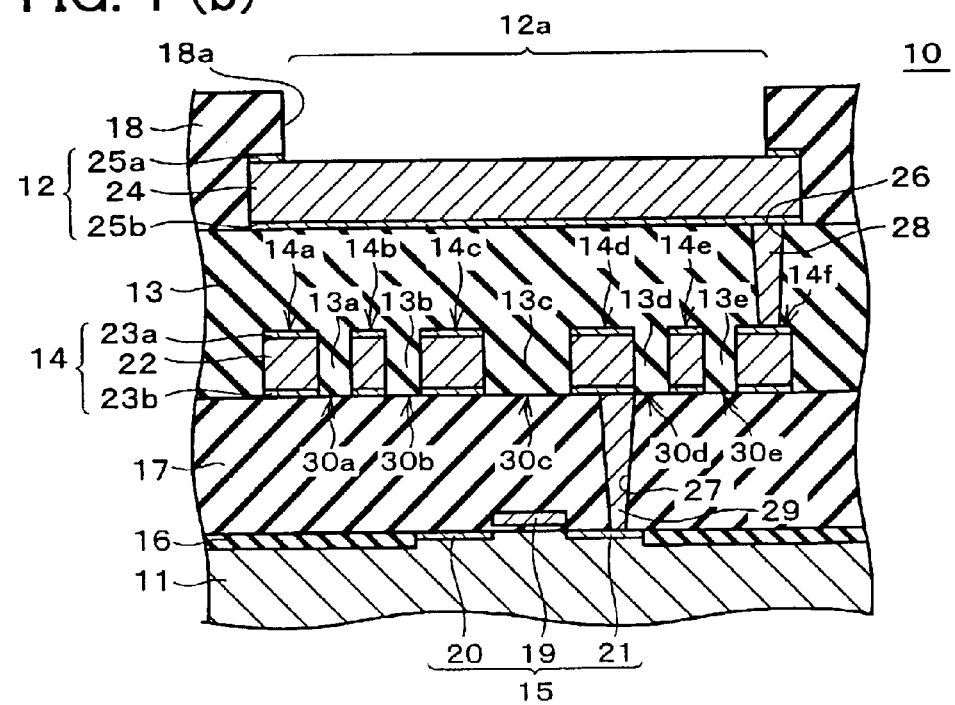

The following will describe one embodiment of the present invention with reference to FIGS. 1(a) and 1(b) through FIG. 7.

FIG. 1(a) is a plan view showing a semiconductor device 10 of the present embodiment, as viewed from the opposite side of a semiconductor substrate 11. FIG. 1(b) is a cross sectional view of the semiconductor device 10 shown in FIG. 1(a), taken along line A—A. Note that, for simplicity, FIG. 1(a) only shows some of the constituting elements illustrated in FIG. 1(b).

The semiconductor device 10 includes at least the following members: the semiconductor substrate 11 (substrate) on which a plurality of layers are stacked; a bonding pad 12 (first conducting layer) having an interconnection region (interconnecting face) 12a that provides for an external electrical contact; a first interlayer insulating layer 13 (insulating layer) interposed between the semiconductor substrate 11 and the bonding pad 12; and a metal wiring layer 14 (second conducting layer) embedded in the first interlayer insulating layer 13.

The semiconductor device 10 further includes: a MOS transistor 15 (semiconductor element) formed on the semiconductor substrate 11; an element separating layer 16 that separates the MOS transistor 15; a second interlayer insulating layer 17 interposed between the first interlayer insulating layer 13 and the semiconductor substrate 11; and a passivation film 18 covering the bonding pad 12 and having an opening 18a that corresponds in area to the interconnection region 12a of the bonding pad 12.

The interconnection region 12a of the bonding pad 12 is exposed through the opening 18a of the passivation film 18, so as to allow for contact with a tester prober in wafer testing, or with a bonding head of a wire bonder in wirebonding. The interconnection region 12a is also an area where a bonding wire is connected, for example.

The substrate, which is the semiconductor substrate 11 in the present embodiment, may be realized by a structure in which a semiconductor layer is deposited on an insulating substrate.

The MOS transistor 15 includes a gate electrode 19, a source region 20, and a drain region 21. The MOS transistor 15 may additionally includes other members such as an insulating layer, a source electrode, and a drain electrode. These additional members, however, are irrelevant in the structure of the MOS transistor 15 in the semiconductor device 10 and accordingly illustrations and explanations thereof are omitted here. Further, the MOS transistor 15 is merely one example of a semiconductor element, and may be replaced with other elements.

Note that, layers, including the MOS transistor 15 and the element separating layer 16, that are interposed between the semiconductor substrate 11 and the second interlayer insulating layer 17, or disposed on the semiconductor substrate 11 may be collectively referred to as "functional layer."

The metal wiring layer 14 may be realized by a single-layer metal thin film; however, it is generally formed by interposing a conducting layer 22, which is the chief structural element, between barrier metal coatings (anti-reflective coatings) 23a and 23b. The barrier metal coatings 23a and 23b are provided to prevent reflection of light that may occur during the exposure in a photolithography process when forming the metal wiring layer 14. Only the barrier metal coating 23a on the upper side of the metal wiring layer 14 may be provided.

Similarly, the bonding pad 12 is generally formed by interposing a conducting layer 24, which is the chief structural element, between barrier metal coatings 25a and 25b. Only the barrier metal coating 25a on the upper side of the bonding pad 12 may be provided. It should be noted that the barrier metal coating 25a should preferably be removed from the interconnection region 12a of the bonding pad 12, so as to provide good contact with a bonding wire or the like.

Generally, the material of the conducting layers 22 and 24 is softer than that used for the first interlayer insulating layer 13 or the barrier metal coatings 23a, 23b, 25a, and 25b. For example, Al or a mixture (alloy) of Al and Cu (Al containing Cu) may be used for the conducting layers 22 and 24, and $SiO_2$ or P-TEOS (Poly-Tetra Ethyl Ortho Silicate) may be used for the first interlayer insulating layer 13, and Ti/TiN (Ti being an adhesive layer, and TiN being a barrier metal coating) may be used for the barrier metal coatings 23a, 23b, 25a, and 25b.

The first interlayer insulating layer 13 is provided to insulate the metal wiring layer 14 from the bonding pad 12. The second interlayer insulating layer 17 is provided to insulate the semiconductor substrate 11 and the functional layer from the metal wiring layer 14. Through predetermined portions of the first interlayer insulating layer 13 and the second interlayer insulating layer 17, via holes 26 and 27 are respectively provided. In the via holes 26 and 27 are embedded plugs 28 and 29, respectively, which provide electrical connections between the bonding pad 12 and the metal wiring layer 14 and between the metal wiring layer and the functional layer, respectively. Note that, in the example of FIG. 1(b), a portion of the metal wiring layer 14 is connected to the drain region 21 of the MOS transistor 15.

In the semiconductor device 10, at least a portion of the metal wiring layer 14 overlaps with the interconnection region 12a in a stacked direction of the layers on the semiconductor substrate 11 (simply referred to as "stacked direction" hereinafter).

The area of metal wiring layer 14 overlapping with the interconnection region 12a (i.e., the area of metal wiring layer 14 directly below the interconnection region 12a) has notches 30a through 30e which extend through the metal wiring layer 14 in the stacked direction and thereby separate the metal wiring layer 14 in the layer direction. Note that, as the term is used herein, "the area of metal wiring layer 14" includes the notches. By the notches 30a through 30e, the metal wiring layer 14 is separated into a plurality of wires 14a through 14f.

Further, as the term is used herein, "stacked direction" is a direction of stack of the layers including the second interlayer insulating layer 17, the metal wiring layer 14, the first interlayer insulating layer 13, the bonding pad 12, and the passivation film 18. That is, the "stacked direction" is substantially a vertical direction with respect to the surface of the semiconductor substrate 11. Further, as the term is used herein, the "layer direction" is a direction of plane of each layer, i.e., a substantially parallel direction with respect to the surface of the semiconductor substrate 11.

Portions of the first interlayer insulting film 13 are embedded in the notches 30a through 30e. In this way, a portion of the first interlayer insulating layer 13 embedded in each of the notches 30a through 30e is rendered a function of a pillar (wall), supporting the upper layer through the metal wiring layer 14 that is made of a softer material. Specifically, the portions of the first interlayer insulating layer 13 embedded in the notches 30a through 30e make up supporting sections 13a through 13e, respectively.

Thus, the area of metal wiring layer 14 overlapping with the interconnection region 12a has a cross sectional structure in which the wires 14a through 14f and the supporting sections 13a through 13f are alternately disposed.

Note that, instead of providing a plurality of notches 30a through 30e as in the present embodiment, only a single notch may be provided in the area of metal wiring layer 14 overlapping with the interconnection region 12a.

Further, the foregoing description of the present embodiment described the case where the notches 30a through 30e are provided in the form of a parallel slit, i.e., in stripes. However, the shape of the notches 30a through 30e is not just limited this. For example, the notches 30a through 30e may have any shape, including a bent shape or curved shape, in the layer direction of the metal wiring layer 14.

Meanwhile, the interconnection region 12a of the bonding pad 12 experiences impact caused by a tester prober in wafer testing, or a bonding head of the wire bonder in bonding. The shock or load of the impact exerts stress on the underlying layer of the interconnection region 12a. Without the provision of the supporting sections 13a through 13e, this stress easily compresses or deforms the conducting layer 22 of the metal wiring layer 14. The stress that compresses or deforms the conducting layer 22 is concentrated in the corresponding area in the overlying layers of the conducting layer 22, including the barrier metal coating 23a, the first interlayer insulating layer 13, and the barrier metal coating 25b. The area of concentrated stress has an increased likelihood of cracking.

On the other hand, the semiconductor device 10 of the present embodiment, by the provision of the supporting sections 13a through 13e, is able to absorb the shock or load of the impact on the interconnection region 12a of the bonding pad 12. The supporting sections 13a through 13e are integral part of the first interlayer insulating layer 13 and therefore are materially harder than the metal wiring layer 14. By thus absorbing the impact by the supporting sections 13a through 13e, it is possible to prevent the metal wiring layer 14 from being deformed.

In the described manner, the stress is prevented from concentrating on portions of the overlying layers of the conducting layer 22, including the barrier metal coating 23a, the first interlayer insulating layer 13, and the barrier metal coating 25b, thereby preventing cracking in these layers.

In conventional structures as exemplified by FIGS. 8(a) and 8(b) and FIGS. 9(a) and 9(b), the conducting layer beneath the interconnection region conducts to the uppermost conducting layer, and the conducting layers within the interconnection region together make up the bonding pad. A drawback of such a structure is that the lower conducting layer within the interconnection region cannot be used as a wire independently from the overlying bonding pad. This has made it difficult to efficiently utilize the lower layer beneath the interconnection region.

On the other hand, in the semiconductor device 10 of the present embodiment, the notches 30a through 30e separate the metal wiring layer 14 into the wires 14a through 14f in the layer direction. This enables one or more wires 14a through 14f (wire 14f in the example of FIG. 1(b)) that are separated by the notches 30a through 30e to be used to connect the bonding pad 12 and the underlying layers, while the others (wires 14a through 14e in the example of FIG. 1(b)) can be used as wires that are insulated from the bonding pad 12.

That is, the area of metal wiring layer 14 overlapping with the interconnection region 12a in the stacked direction can be insulated from the interconnection region 12a and used as independent wires. The wires 14a through 14e, which are independent, can be used to connect other electrical circuit elements of the semiconductor device. For example, discrete electrical circuit elements on the plane of the semiconductor substrate 11 can be connected to one another. Note that, as used herein, "other electrical circuit elements" are semiconductor elements incorporated in the semiconductor device 10, including, for example, NMOS transistors, PMOS transistors, resistive elements, diodes, and capacitors.

In addition to the circuit elements shown in FIG. 1(a) and FIG. 1(b) including the bonding pad 12 and the MOS transistor 15, the semiconductor device 10 also includes other bonding pads and MOS transistors, as well as other electrical circuit elements. Using the wires 14a through 14f beneath the interconnection region 12a shown in FIG. 1(a) and FIG. 1(b), the semiconductor device 10 is able to connect these electrical circuit elements to one another, other than the bonding pad 12 and the MOS transistor 15 shown in FIG. 1(a) and FIG. 1(b). That is, in the semiconductor device 10 of the present embodiment, the layout of wiring on the plane of the metal wiring layer 14 can be designed more flexibly.

In the described manner, in the semiconductor device 10 of the present embodiment, at least one of the portions (wires 14a through 14f) of the metal wiring layer 14 that are separated by the notches 30a through 30e can be used as wires that extend in the layer direction of the metal wiring layer 14. This enables the semiconductor device 10 to use the underlying layer of the interconnection region 12a more efficiently as a free wiring area, thereby reducing the size of the semiconductor device 10.

As described, with the structure of the semiconductor device 10, it is possible to efficiently utilize the underlying layers of the interconnection region 12a while preventing cracking in these layers. As a result, the size of the semiconductor device 10 can be reduced.

In the semiconductor device 10 of the present embodiment, the MOS transistor 15 as a semiconductor element is provided in the area of semiconductor substrate 11 overlapping with the interconnection region 12a in the stacked direction. This structure is known as the area pad structure, in which the semiconductor element is provided beneath the interconnection region 12a. As described, the semiconductor device 10 of the present embodiment is structured such that the impact on the interconnection region 12a does not cause cracking in the underlying layers of the interconnection region 12a. Thus, despite the fact that the MOS transistor 15 is provided beneath the interconnection region 12a, the semiconductor device 10 is relatively free from the problem of shorting. It is therefore possible, despite the area pad structure, to efficiently utilize the underlying layers of the interconnection region 12a and thereby reduce the size of the semiconductor device 10.

It is preferable that more than one notch is provided and a portion of the first interlayer insulating layer 13 is embedded in each of the notches 30a through 30e, as shown in FIG. 1(a) and FIG. 1(b).

In this way, more than one supporting sections 13a through 13e can be formed in the area of metal insulating layer 14 overlapping with the interconnection region 12a, so that the impact on the interconnection region 12a can be absorbed by a plurality of supporting sections 13a through 13e. With the plurality of supporting sections 13a through 13e, deformation of the metal wiring layer 14 beneath the interconnection region 12a can be prevented more stably and over a wider area. Further, because the force of impact can be spread over a plurality of supporting sections 13a through 13e, the device can withstand greater impact.

As illustrated in FIG. 1(a), the notches 30a through 30e may be formed, for example, in the form of a slit that extends in the layer direction of the metal wiring layer 14, i.e., in the form of a straight groove. Preferably, the notches 30a through 30e are positioned parallel to one another with respect to their direction of extension, so that the notches 30a through 30e can be placed more uniformly beneath the interconnection region 12a, and the wires 14a through 14f can be disposed more densely.

Here, cracking can be prevented more effectively when the combined width of the wires 14a through 14f on a cross sectional plane that is orthogonal to the direction of extension of the notches 30a through 30e (for example, the cross section of FIG. 1(b)) is not more than a predetermined width that is shorter than the width of the interconnection region 12a, and when the combined width of the notches 30a through 30e on the cross sectional plane is not less than a predetermined width that is shorter than the width of the interconnection region 12a.

Figure 2:
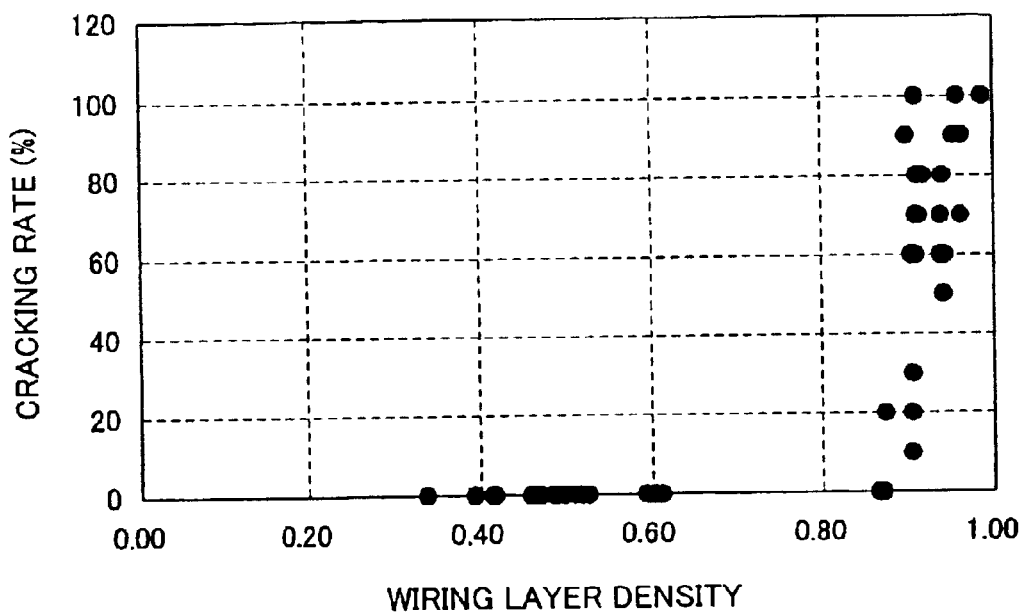
FIG. 2 is a graph representing a relationship between wiring layer density and cracking rate.

FIG. 2 represents a relationship between wiring layer density and cracking rate. As the term is used herein, "wiring layer density" is a proportion of an area occupied by the wires 14a through 14f in the area of metal wiring layer 14 overlapping with the interconnection region 12a in the stacked direction. That is, the wiring layer density is a proportion of a non-notch portion (leaving out notches 30a through 30e) in the area of metal wiring layer 14 overlapping with the interconnection region 12a in the stacked direction.

Figure 8:
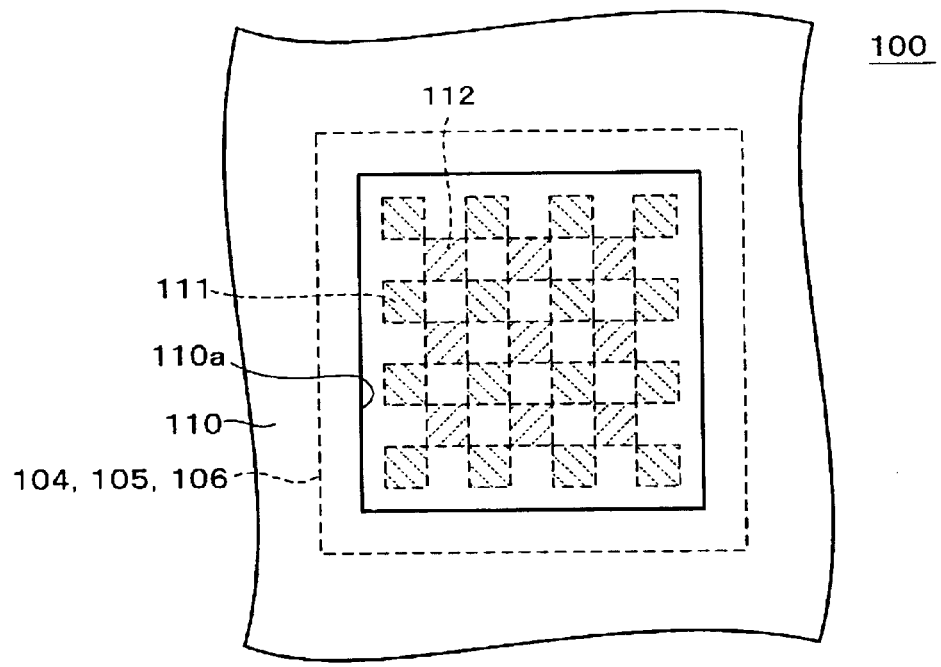
Figure 8:
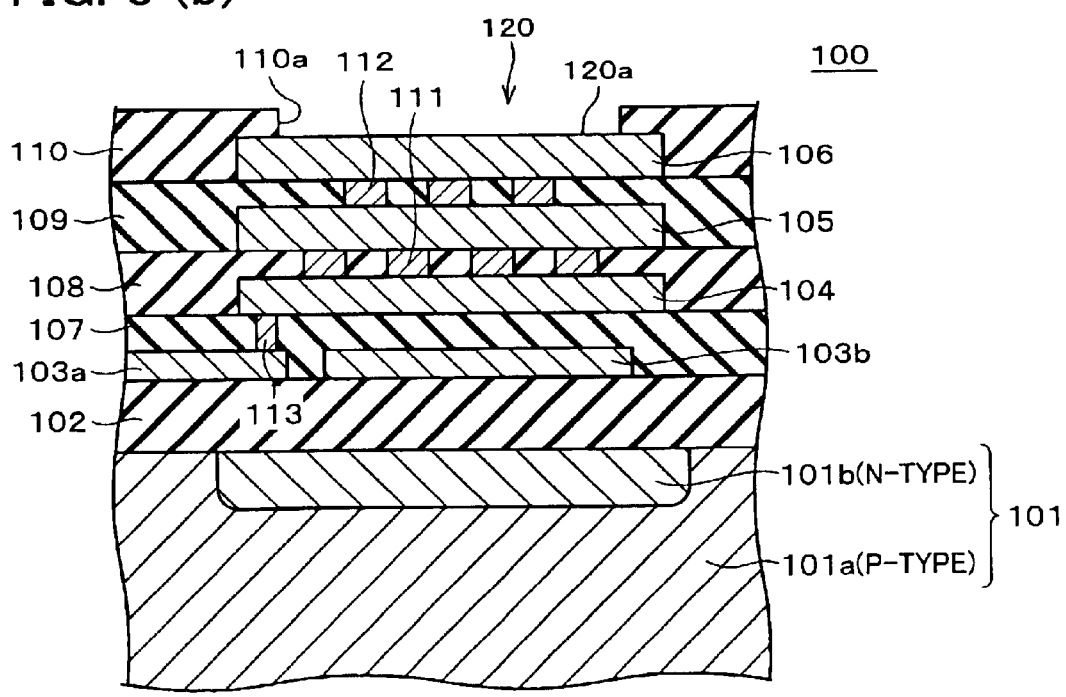
Figure 9:
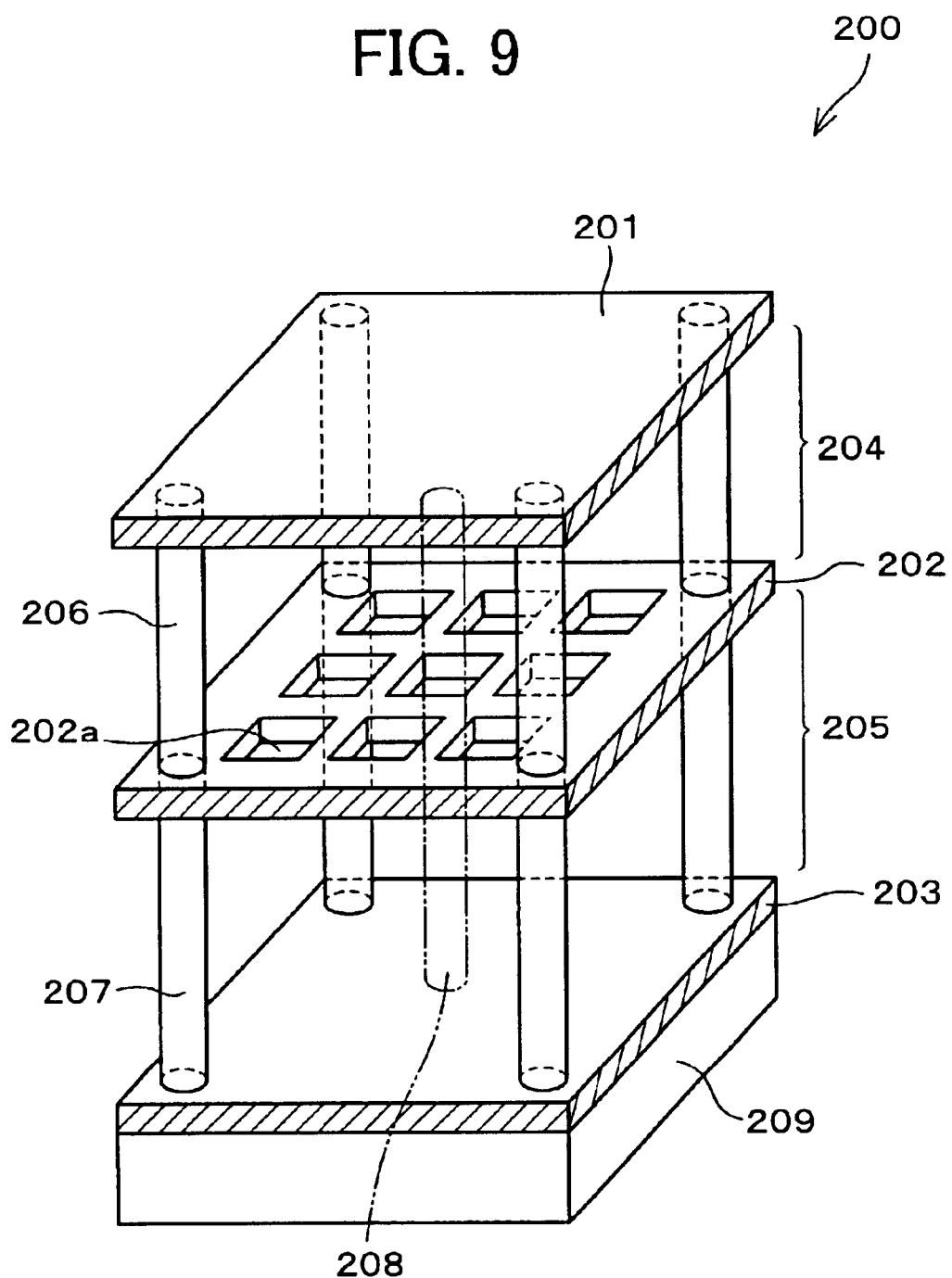
FIG. 9 is a perspective view showing a bonding pad portion of a conventional semiconductor device.

The conventional structure shown in FIG. 8(a) and FIG. 8(b) has a wiring layer density of 1. That is, the greater the wiring layer density, the greater the similarity to the conventional structure, with the result that the cracking rate increases. As FIG. 2 indicates, the cracking rate increases with increase in wiring layer density. The cracking rate is nearly 100 percent when the wiring layer density is close to 1.

On the other hand, the cracking rate is 0 percent when the wiring layer density is at or below 0.87. It is therefore preferable to confine the wiring layer density within a range of not more than 0.87. (That is, a proportion of the non-notch portion of metal wiring layer 14 [leaving out notches 30a through 30e] overlapping with the interconnection region 12a in the stacked direction should preferably be no greater than 87 percent.) More preferably, the wiring layer density should be not more than 0.80, taking into account a margin of error. For assurance, the wiring layer density should be not more than 0.60.

Note that, from the standpoint of suppressing cracking, the wiring layer density should be set as small as possible. However, a wiring layer density of 0 percent cannot be achieved because the metal wiring layer 14 at least partially overlaps with the interconnection region 12a.

Figure 3:
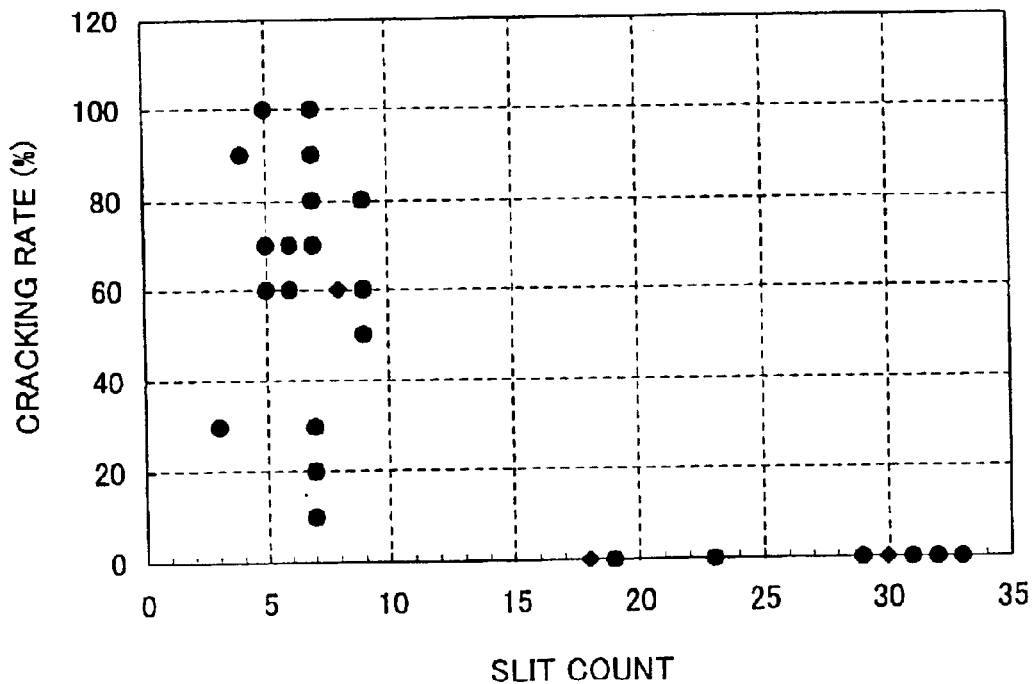
FIG. 3 is a graph representing a relationship between slit count and cracking rate.

FIG. 3 represents a relationship between slit count and cracking rate. The slit count is the number of notches in the area of metal wiring layer 14 overlapping with the interconnection region 12a in the stacked direction. FIG. 3 assumes that the interconnection region 12a has a width of 90 µm in the cross section (for example, the cross section shown in FIG. 1(b)) that orthogonally cuts across the direction of extension of the slits.

The conventional structure shown in FIG. 8(a) and FIG. 8(b) has a slit count of 0. That is, the smaller the slit count, the greater the similarity to the conventional structure, with the result that the cracking rate increases. As FIG. 3 indicates, the cracking rate increases with decrease in slit count.

The cracking rate is 0 percent when the slit count is 18 or greater. It is therefore preferable to have a slit count of 18 or greater. More preferably, the slit count should be 20 or greater, taking into account a margin of error.

The influence of slit count can be more fully understood by considering the slit count in terms of slit count density (density of averaged notch count). As the term is used herein, "slit count density" is the density of averaged slit count in the layer direction of the metal wiring layer 14 on the cross section that orthogonally cuts across the direction of extension of the slits in the area of metal wiring layer 14 overlapping with the interconnection region 12a in the stacked direction. That is, the slit count density is the averaged slit count per unit length. In the foregoing example, the slit count of 18 give the slit count density of $18/90 \mu m = 0.2/\mu m$. Likewise, the slit count of 20 give the slit count density of $20/90 \mu m \approx 0.22/\mu m$.

Note that, from the standpoint of suppressing cracking, the slit count density should be set as large as possible. However, increasing the slit count density decreases the width of notches, which makes it difficult to form notches. Thus, the slit count density should be set within a possible range of forming notches.

As described, the slit count and wiring layer density, which are inversely related to each other, can be varied to suppress cracking rate. The cracking rate can be suppressed reliably by selecting such a width (in the layer direction orthogonal to the direction of extension of the notches 30a through 30e) for the notches 30a through 30e and by selecting such a width (in the layer direction orthogonal to the direction of extension of the wires 14a through 14f) for the wires 14a through 14f as to increase the slit count, for example, to preferably not less than $0.22/\mu m$ and decrease the wiring layer density, for example, to preferably not more than 0.6.

For example, when the interconnection region 12a has a width of 90 $\mu m$ on the cross section that orthogonally cuts across the direction of extension of the slits, the width of the notches 30a through 30e should preferably be not less than 1.8 $\mu m$ (but no greater than the acceptable maximum value of the manufacturing process), and the width of the wires 14a through 14f should preferably be not more than 2.7 $\mu m$ (but not smaller than the acceptable minimum value of the manufacturing process). In this way, a slit count density of not smaller than $0.22/\mu m$ and a wiring layer density of not more than 0.6 can be achieved.

Figure 4:
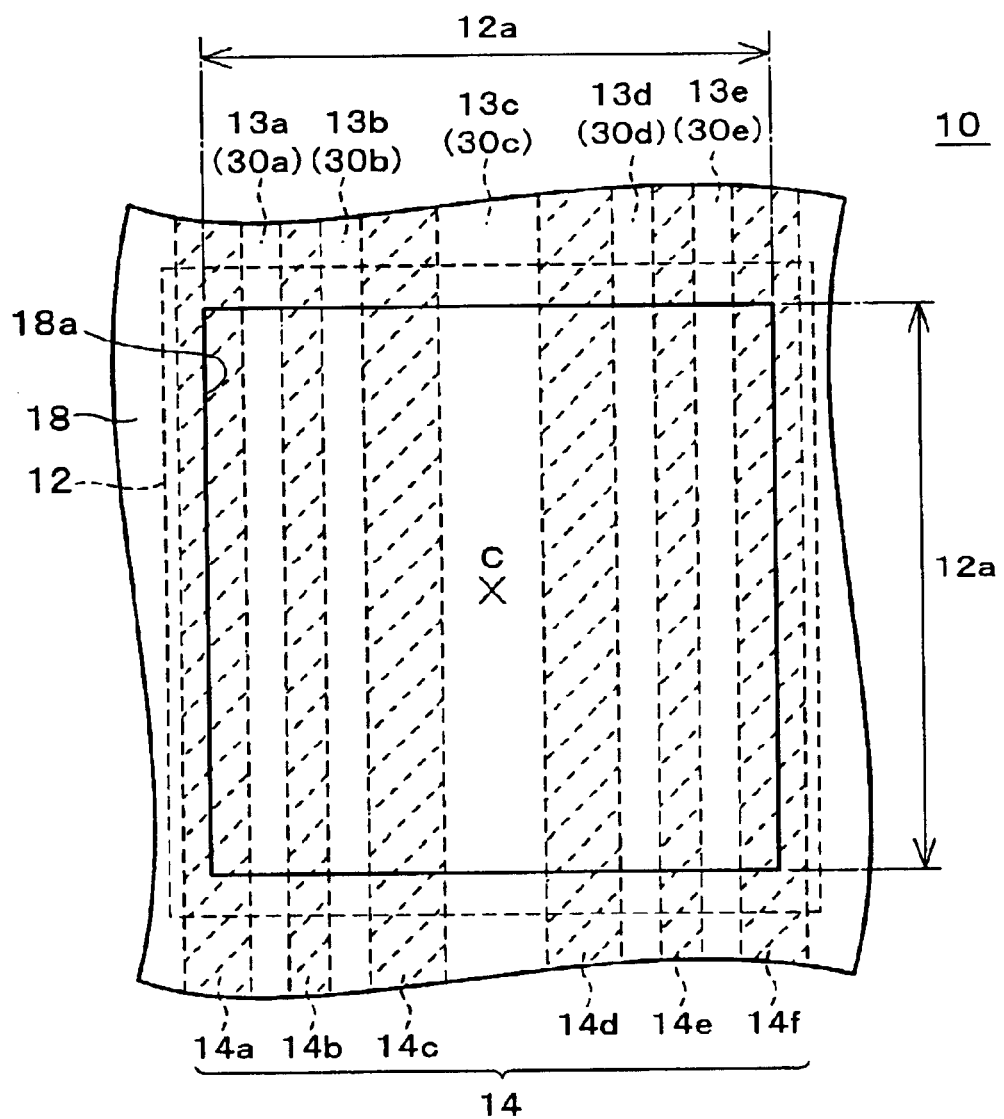
FIG. 4 is an explanatory drawing showing positioning of notches in the semiconductor device of FIG. 1.

Further, among the notches 30a through 30e that are disposed in the area of metal wiring layer 14 overlapping with the interconnection region 12a in the stacked direction, the notch 30c should preferably be positioned on the corresponding portion of center C of the interconnection region 12a, as shown in FIG. 4. As with FIG. 1(a), FIG. 4 is a plan view of the semiconductor device 10 as viewed from the opposite side of the semiconductor substrate 11.

The force of impact on the interconnection region 12a is greater toward the center than the periphery of the interconnection region 12a. This is because the force is usually exerted around the center of the interconnection region 12a, for example, by a bonding head in the bonding process. Thus, by positioning the notch 30c on the corresponding portion of the center of the interconnection region 12a and thereby forming the supporting section 13c in this portion of the metal wiring layer 14, the area of maximum impact and maximum stress can be effectively supported by the supporting section 13c. This ensures that cracking is suppressed more reliably.

Note that, as the term is used herein, the "center" of the interconnection region 12a is a point of intersection of diagonal lines when the interconnection region 12a is rectangular, and is the center of a circle when the interconnection region 12a is circular. Generally speaking, the center of the interconnection region 12a is the center of gravity of the interconnection region 12a.

Figure 5:
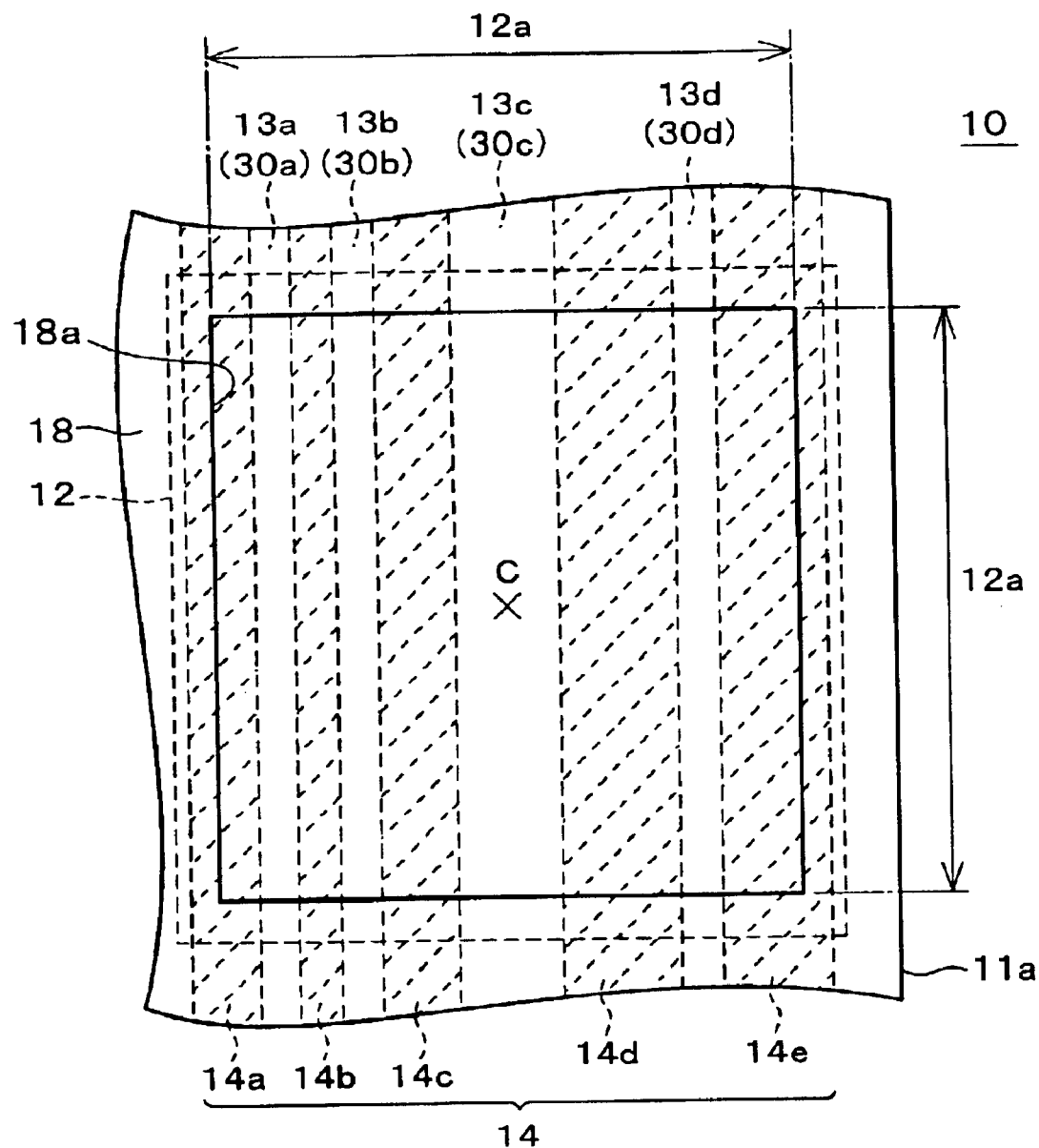
FIG. 5 is an explanatory drawing showing another positioning of notches in the semiconductor device of FIG. 1.
Figure 5:
Figure 7:
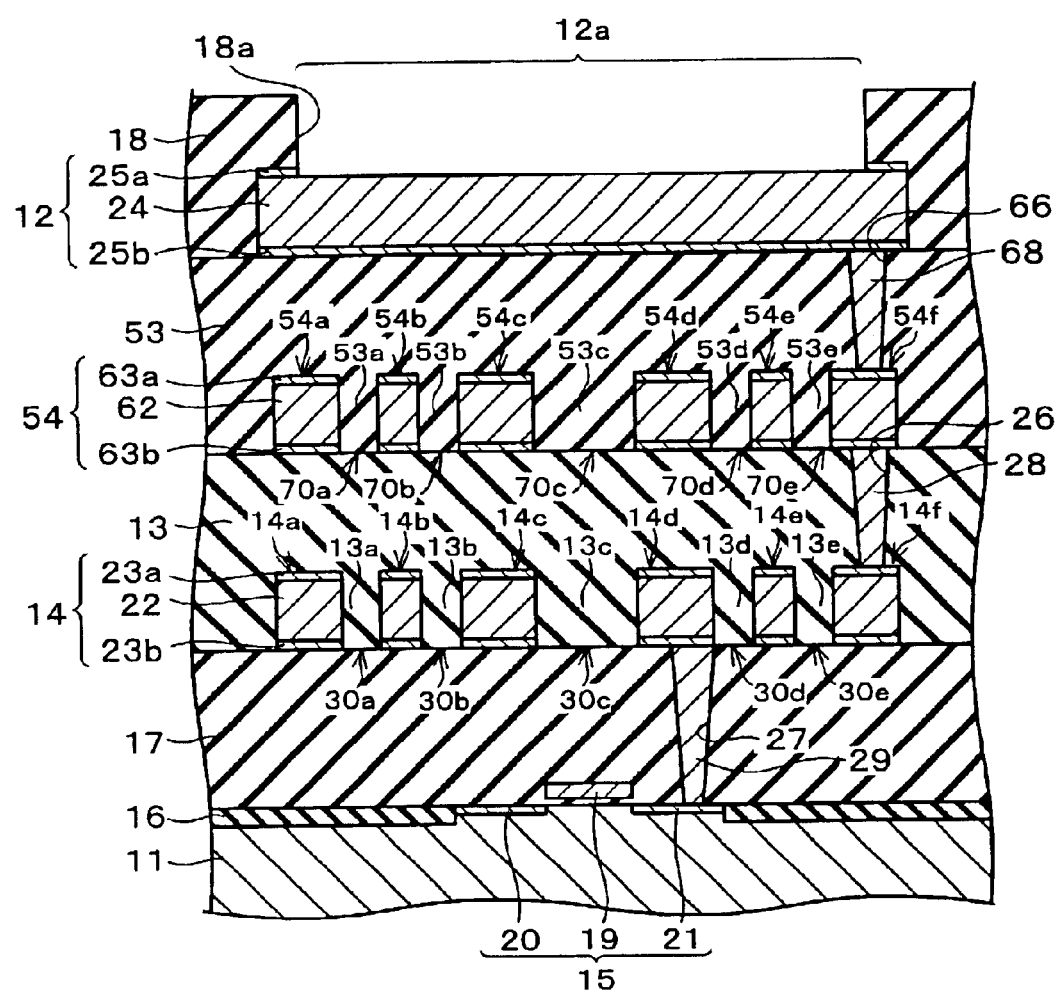
FIG. 7 is a cross sectional view showing one modification of the semiconductor device of FIG. 1.

In FIG. 4, the notches 30a through 30e, the supporting sections 13a through 13e, and the wires 14a through 14f are symmetrical about the center C of the interconnection region 12a. Alternatively, the notches 30a through 30e, the supporting sections 13a through 13e, and the wires 14a through 14f may be positioned in the manner shown in FIG. 5. In FIG. 5, the number of notches and supporting sections in the area of metal wiring layer 14 overlapping with the interconnection region 12a in the stacked direction is greater on the inner side of the semiconductor substrate 11 than the outer side with respect to the center C of the interconnection region 12a. As illustrated in FIG. 5, the notch 30d and the supporting section 13d are positioned on the outer side of the semiconductor substrate 11, whereas the notches 30a and 30b and the supporting sections 13a and 13b are positioned on the inner side of the semiconductor substrate 11. Accordingly, the area density of the wires 14a through 14e is smaller on the inner side of the semiconductor substrate 11 than the outer side.

In applications where the interconnection region 12a is used for wire bonding, a bonding head in the bonding process is generally moved from the end toward the center of the semiconductor substrate 11 before it makes a contact with the interconnection region 12a. Here, the stress generated by the force of impact due to the bonding head on the interconnection region 12a is greater on the inner side of the substrate than the outer side.

Thus, by forming more notches and supporting sections on the inner side of the substrate than the outer side, the area of greater stress can be supported on a greater number of supporting sections by spreading the stress over these supporting sections, thereby enabling the semiconductor device to withstand stronger impact.

Note that, as the term is used herein, the "end" of the semiconductor substrate 11 refers to an end 11a of the semiconductor substrate 11 in its product form in the semiconductor device 10. Accordingly, in the usual fabrication process of the semiconductor device in which a great number of semiconductor devices are fabricated on a large-area semiconductor substrate and are later separated into individual pieces by cutting the semiconductor substrate in a predetermined step of the process, each piece of semiconductor device would have its own end where it is cut.

Referring to FIG. 6(a) through FIG. 6(d), the following describes a fabrication method of the semiconductor device 10. It should be noted that materials, fabrication methods, and specific values for the constituting layers of the semiconductor device 10 below are given as examples and may be suitably modified.

First, as shown in FIG. 6(a), the functional layer, including the MOS transistor 15 and the element separating layer 16, is formed on the semiconductor substrate 11. Then, a BPSG film is deposited thereon in a thickness of 9000 Å by a chemical vapor deposition (CVD) method, so as to form the second interlayer insulating layer 17. Through a predetermined portion of the second interlayer insulating layer 17, the via hole 27 is formed and plug 29 is embedded in the via hole 27.

Thereafter, the metal wiring layer 14 is deposited on the second interlayer insulating layer 17 (second conducting layer forming step). The metal wiring layer 14 is formed by depositing a 200 Å thick TiN film for the barrier metal coating 23b, a 4000 Å thick Al film for the conducting layer 22, and a 200 Å thick TiN film for the barrier metal coating 23a in this order.

Then, as shown in FIG. 6(b), the metal wiring layer 14 is patterned into a predetermined pattern by a photolithography technique or metal thin film processing technique. The result of this patterning is the notches 30a through 30e that extend through the metal wiring layer 14 in the stacked direction and separates the metal wiring layer 14 in the layer direction (notch forming step). In this example, the metal wiring layer 14 is patterned such that the area of metal wiring layer 14 that would overlap with the later formed interconnection region 12a of the bonding pad 12 has the wires 14a through 14f and the notches 30a through 30e in stripes, with the width of the wire being 1.5 μm and the width of the notch being 1.5 μm.

Next, as shown in FIG. 6(c), a P-TEPS film is deposited in a thickness of 15000 Å over the second interlayer insulating layer 17 and over the metal wiring layer 14 that has been patterned, so as to form the first interlayer insulating layer 13. Here, the first interlayer insulating layer 13 is deposited in such a manner that it covers the metal wiring layer 14 and fills the notches 30a through 30e (insulating layer forming step). Through a predetermined portion of the first interlayer insulating layer 13, the via hole 26 if formed and plug 28 is embedded in the via hole 26.

Thereafter, as shown in FIG. 6(d), the bonding pad 12 is formed on the first interlayer insulating layer 13. The bonding pad 12 is formed first by depositing a 200 Å thick TiN film for the barrier metal coating 25b, a 6000 Å thick Al film for the conducting layer 24, and a 200 Å thick TiN film for the barrier metal coating 25a in this order, and then by patterning these layers into a predetermined pattern using a photolithography technique or metal thin film processing technique. In this example, the patterning is made to create bonding pad 12 of a 100 μm×100 μm square.

Then, a BPSG film is deposited in a thickness of 10000 Å over the first interlayer insulating layer 13 and over the bonding pad 12 that has been patterned, so as to form the passivation film 18. Using a photolithography technique or metal thin film processing technique, the passivation film 18 so formed is patterned to create the opening 18a in the bonding pad 12, so as to provide the interconnection region 12a. In this example, the patterning is made to create interconnection region 12a of a 90 μm×90 μm square.

Note that, the bonding pad 12 and interconnection region 12a are formed such that the interconnection region 12a overlaps in the stacked direction with the area of metal wiring layer 14 where the notches 30a through 30e are formed (first conducting layer forming step).

In this fabrication method, at least one of the portions of metal wiring layer 14 separated by the notches 30a through 30e may be used as the wire (wire 14a through 14f) that extends in the layer direction of the metal wiring layer 14. Further, the notches 30a through 30e may be formed in the form of a slit that extends in the layer direction of the metal wiring layer 14. Further, in the notch forming step, more than one notch may be formed in the area of metal wiring layer 14 overlapping with the interconnection region 12a in the stacked direction.

The semiconductor device 10 is fabricated through the foregoing steps. This fabrication method can be implemented using materials and manufacturing conditions that are commonly used by conventional semiconductor device fabrication processes, and the method does not specifically require any additional steps except for changing the patterning of the metal wiring layer 14. Further, unlike conventional area pad techniques, the foregoing fabrication method does not require placing a thin film of organic material such as a polyimide film beneath the bonding pad. Accordingly, it is not required to additionally provide a material, a processing device, or a processing step for such an organic thin film, which makes it possible to suppress cost of the semiconductor device.

The foregoing described the case where only a single metal wiring layer 14 is provided in the semiconductor device 10. However, two or more metal wiring layers may be provided instead. For example, as illustrated in a semiconductor device 50 of FIG. 7, two metal wiring layers (second conducting layers) 14 and 54 may be provided. The constituting elements of the semiconductor device 50 that are functionally equivalent to those described in connection with the semiconductor device 10 are given the same reference numerals. The semiconductor device 50 is provided with functionally equivalent sets of first interlayer insulating layers 13 and 53; supporting sections 13a through 13e and 53a through 53e; metal wiring layers 14 and 54; wires 14a through 14f and 54a through 54f; conducting layers 22 and 62; barrier metal coatings 23a, 23b and 63a, 63b; via holes 26 and 66; plugs 28 and 68; and notches 30a through 30e and 70a through 70e.

It is preferable in the semiconductor device 50 that the notches 30a through 30e overlap with the notches 70a through 70e in the stacked direction. This enables the supporting sections 13a through 13e to be aligned with the supporting sections 53a through 53e in the stacked direction, so as to provide good support.

Noted that, not all metal wiring layers needs to have notches. However, the notch should preferably be formed in the metal wiring layer closest to the bonding pad 12.

It should be appreciated that the foregoing embodiment is not intended to restrict the present invention in any ways, and various modifications of the present invention is possible within the scope of the claimed invention. According to various aspects of the invention, the semiconductor device and the fabrication method thereof have the features described below.

The semiconductor device of the present invention is made up of a plurality of metal layers, in which an uppermost first metal layer makes up a bonding pad, and a semiconductor element is formed beneath the bonding pad, wherein beneath the first metal layer is a second metal layer that is patterned to have a second metal layer pattern which provides at least one narrow slit beneath the bonding pad.

In the semiconductor device of the present invention, the second metal layer beneath the bonding pad has portions no wider than a predetermined line width which is narrower than a width of the bonding pad, and between these portions of the second metal layer is formed an insulating layer of no narrower than a predetermined line width.

In the semiconductor device of the present invention, a narrow slit through the second metal layer beneath the bonding pad is positioned such that the slit is on a center of the binding pad.

In the semiconductor device of the present invention, the slits are greater in number on the inner side of the chip than the outer side with respect to the center of the bonding pad.

The fabrication method of the semiconductor device includes the steps of depositing the first metal layer, depositing the second metal layer, and shaping the second metal layer in stripes of a predetermined width and a predetermined interval.

The fabrication method of the semiconductor device includes the step of shaping the second metal layer in stripes of a predetermined width and a predetermined interval beneath the first metal layer.

In the semiconductor device of the present invention, at least one of the portions of second conducting layer separated by the notch may be used as a wire that extends in the layer direction of the second conducting layer.

In the fabrication method of the semiconductor device of the present invention, at least one of the portions of second conducting layer separated by the notch may be used as a wire that extends in the layer direction of the second conducting layer.

With the foregoing structure, it is possible to efficiently utilize the underlying layers of the interconnection region while preventing cracking in these layers. As a result, the size of the semiconductor device can be reduced.

Further, the semiconductor device of the present invention may be adapted so that the substrate is a semiconductor substrate, and a semiconductor element is formed in an area of semiconductor substrate overlapping with the interconnection region in the stacked direction.

This structure is known as an area pad structure, in which the semiconductor element is formed beneath the interconnection region. As described, the semiconductor device of the present invention is structured such that the impact on the interconnection region of the first conducting layer does not cause cracking in the underlying layers of the interconnection region. Thus, despite the construction in which the semiconductor element is provided beneath the interconnection region, the semiconductor device is relatively free from the problem of shorting. It is therefore possible, despite the area pad structure, to efficiently utilize the underlying layers of the interconnection region and thereby reduce the size of the semiconductor device.

Further, the semiconductor device of the present invention may be adapted so that the area of second conducting layer overlapping with the interconnection region in the stacked direction has a plurality of notches, and a portion of the insulating layer is embedded in each of the notches.

With the structure in which a plurality of notches are formed in the area of second conducting layer overlapping with the interconnection region and a portion of the insulating layer is embedded in each of the notches, a plurality of supporting sections can be formed in the area of the second conducting layer overlapping with the interconnection region. This enables the force of impact on the interconnection region of the first conducting layer to be absorbed by a plurality of supporting sections, thereby stably suppressing deformation of the second conducting layer beneath the interconnection region. Further, by spreading the force of impact over a plurality of supporting sections, the semiconductor device can withstand stronger impact.

The fabrication method of the semiconductor device includes the step of forming a notch, in which a plurality of notches are formed in the area of the second conducting layer overlapping with the interconnection region in the stacked direction.

It is preferable in the semiconductor device of the present invention that the notches in the area of the second conducting layer overlapping with the interconnection region in the stacked direction are greater in number on the inner side of the substrate than the outer side with respect to a portion of the substrate corresponding to the center of the interconnection region.

With this configuration, in the area of second conducting layer overlapping with the interconnection region, more notches are formed on the inner side of the substrate than the outer side with respect to a portion of the substrate corresponding to the center of the interconnection region. In applications where the interconnection region is used for wire bonding, a bonding head in the bonding process is generally moved from the end toward the center of the substrate before it makes a contact with the interconnection region. Here, the stress generated by the force of impact due to the bonding head on the interconnection region is greater on the inner side of the substrate than the outer side.

Thus, by forming more notches and supporting sections on the inner side of the substrate than the outer side, the area of greater stress can be supported on a greater number of supporting sections by spreading the stress over these supporting sections, thereby withstanding stronger impact.

It is preferable in the semiconductor device of the present invention that the notches in the area of the second conducting layer overlapping with the interconnection region of the first conducting layer in the stacked direction are positioned such that one of the notches is on a portion of the second conducting layer corresponding to the center of the interconnection region.

In this configuration, the notch is positioned to correspond to the center of the interconnection region. The force of impact on the interconnection region is greater toward the center than the periphery of the interconnection region. This is because the force is usually exerted around the center of the interconnection region, for example, by a bonding head in the bonding process. Thus, by positioning the notch on the corresponding portion of the center of the interconnection region and thereby forming the supporting section in this portion of the second conducting layer, the area of maximum impact and maximum stress can be effectively supported by the supporting section. This ensures that cracking is suppressed more reliably.

The semiconductor device of the present invention may be adapted so that the notch is formed in the form of a slit that extends in the layer direction of the second conducting layer.

It is preferable in the semiconductor device of the present invention that a proportion of an area excluding the notch in the area of second conducting layer overlapping with the interconnection region of the first conducting layer in the stacked direction is no greater than 87 percent.

With this configuration, cracking can be suppressed more reliably. Note that, from the standpoint of suppressing cracking, the proportion should be set as small as possible. However, a proportion of 0 percent cannot be achieved because the second conducting layer at least partially overlaps with the interconnection region.

It is preferable in the semiconductor device of the present invention that the notches in the area of second conducting layer overlapping with the interconnection region of the first conducting layer in the stacked direction are provided such that the notches in the layer direction of the second conducting layer on a cross section that orthogonally cuts across a direction of extension of the notches have an average count density of $0.2/\mu m$.

With this configuration, cracking can be suppressed more reliably. From the standpoint of suppressing cracking, the average count density should be set as large as possible. However, increasing the average count density decreases the width of notches, which makes it difficult to form notches. Thus, the average count density should be set within a possible range of forming notches.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:

a substrate;

a first conducting layer having an interconnection region that provides for an external electrical contact;

an insulating layer interposed between the substrate and the first conducting layer; and a second conducting layer embedded in the insulating layer and made of a softer material than that of the insulating layer, the first conducting layer, the insulating layer, and the second conducting layer being stacked on the substrate, the second conducting layer having an area that at least partially overlaps with the interconnection region in a stacked direction of the first conducting layer, die insulating layer, and the second conducting layer, the area of the second conducting layer overlapping with the interconnection region having at least one notch that extends through die second conducting layer in the stacked direction and separates the second conducting layer in a layer direction of the second conducting layer, a portion of the insulating layer being embedded in the notch.

2. The semiconductor device as set forth in claim 1, wherein at least one of the portions of the second conducting layer separated by the notch is a wire that extends in the layer direction of the second conducting layer.

3. The semiconductor device as set forth in claim 2, further comprising:

a plurality of discrete electric circuit elements, wherein the discrete electric circuit elements are connected to one another by the wire.

4. The semiconductor device as set forth in claim 3, wherein:

the substrate is a semiconduct or substrate, and the semiconductor substrate has an area where a semiconductor element is formed, and the semiconductor element is connected to the first conducting layer via the portion of the second conducting layer separated by the notch, other than the portion making up the wire.

5. The semiconductor device as set forth in claim 1, wherein:

the substrate is a semiconductor substrate, and the semiconductor substrate includes a semiconductor element in an area that overlaps with the interconnection region in the stacked direction.

6. The semiconductor device as set forth in claim 1, wherein a plurality of the notches are formed in the area of the second conducting layer overlapping with the interconnection region in the stacked direction, and a portion of the insulating layer is embedded in each of the notches.

7. The semiconductor device as set forth in claim 6, wherein the notches in the area of the second conducting layer overlapping with the interconnection region in the stacked direction are greater in number on an inner side of the substrate than an outer side of the substrate with respect to a portion of the second conducting layer corresponding to a center of the interconnection region.

8. The semiconductor device as set forth in claim 1, wherein one of the notches in the area of the second conducting layer overlapping with the interconnection region in the stacked direction is positioned to correspond to a center of the interconnection region.

9. The semiconductor device as set forth in claim 1, wherein the notch is formed in the form of a slit that extends in the layer direction of the second conducting layer.

10. The semiconductor device as set forth in claim 1, wherein the notch has a bent shape in the layer direction of the second conducting layer.

11. The semiconductor device as set forth in claim 1, wherein the notch has a curved shape in the layer direction of the second conducting layer.

12. The semiconductor device as set forth in claim 9, wherein:

a plurality of the notches are formed in the area of the second conducting layer overlapping with the interconnection region in the stacked direction, and a portion of the insulating layer is embedded in each of the notches, and the notches are disposed parallel to one another with respect to a direction of extension of the notches.

13. The semiconductor device as set forth in claim 9, wherein a proportion of an area excluding the notch in the area of the second conducting layer overlapping with the interconnection region in the stacked direction is no greater than 87 percent.

14. The semiconductor device as set forth in claim 9, wherein: a plurality of the notches are formed in the area of the second conducting layer overlapping with the interconnection region in the stacked direction, and a portion of the insulating layer is embedded in each of the notches, and the notches in the area of the second conducting layer overlapping with the interconnection region in the stacked direction are provided such that the notches in the layer direction of the second conducting layer have an average count density of not less than $0.2/\mu m$ on a cross section that orthogonally cuts across a direction of extension of the notches.

15. The semiconductor device as set forth in claim 1, wherein the second conducting layer constitutes two or more layers.

16. The semiconductor device as set forth in claim 15, wherein the two or more second conducting layers are positioned such that the notches of the second conducting layers overlap with one another in the stacked direction.

17. The semiconductor device as set forth in claim 1, wherein the second conducting layer is made of Al or a mixture of Al and Cu, and the insulating layer is made of $SiO_2$ or Poly-Tetra Ethyl Ortho Silicate.

* * * * *

UNITED STATES PATENT AND TRADEMARK OFFICE
CERTIFICATE OF CORRECTION

| | | |
|---|---|---|
| PATENT NO. | : 6,847,124 B2 | |
| APPLICATION NO. | : 10/452907 | |
| DATED | : January 25, 2005 | |
| INVENTOR(S) | : Semi | |

It is certified that error appears in the above-identified patent and that said Letters Patent is hereby corrected as shown below:

Claim 1, line 14 (Column 17, line 26), please change "die" to --the--;

Claim 1, line 18 (Column 17, line 30), please change "die" to --the--;

Claim 4, line 3 (Column 17, line 46), please change "conduct or" to --conductor--.

Signed and Sealed this
First Day of March, 2011

David J. Kappos
*Director of the United States Patent and Trademark Office*